United States Patent [19]
Caywood

[11] Patent Number: 5,235,544
[45] Date of Patent: Aug. 10, 1993

[54] FLASH EPROM CELL AND METHOD FOR OPERATING SAME

[75] Inventor: John Caywood, 1410 Wright Ave., Sunnyvale, Calif. 94087

[73] Assignee: John Caywood, Sunnyvale, Calif.

[21] Appl. No.: 611,423

[22] Filed: Nov. 9, 1990

[51] Int. Cl.[5] .................. G11C 11/34; G11C 7/00
[52] U.S. Cl. ................... 365/185; 365/218; 365/900; 257/322; 257/900
[58] Field of Search .......... 365/185, 218, 900; 257/322, 315, 900

[56] References Cited

U.S. PATENT DOCUMENTS

| | | | |
|---|---|---|---|
| 4,004,159 | 1/1977 | Rai et al. ............ | 365/185 X |
| 4,399,523 | 8/1983 | Gerber et al. ........ | 365/218 |
| 5,060,195 | 10/1991 | Gill et al. ........... | 365/185 |
| 5,070,480 | 12/1991 | Caywood ............. | 365/49 |
| 5,077,691 | 12/1991 | Haddad et al. ...... | 365/218 |
| 5,097,444 | 3/1992 | Fong .................. | 365/185 |
| 5,103,273 | 4/1992 | Gill et al. ........... | 365/185 X |
| 5,126,808 | 6/1992 | Montalvo et al. .... | 365/185 X |

FOREIGN PATENT DOCUMENTS

| | | | |
|---|---|---|---|
| 0320916 | 6/1989 | European Pat. Off. ....... | 365/185 |
| 0108772 | 5/1991 | Japan .............................. | 365/218 |

*Primary Examiner*—Joseph E. Clawson, Jr.
*Assistant Examiner*—Son Dinh
*Attorney, Agent, or Firm*—Kenneth D'Alessandro

[57] ABSTRACT

A flash EPROM cell may be erased by placing a negative voltage on the control gate of a flash EPROM cell having spaced apart source and drain regions in a semiconductor substrate, and having a floating gate, a control gate and a sidewall gate, while biasing the drain at a positive voltage.

2 Claims, 2 Drawing Sheets

FLASH EPROM CELL AND METHOD FOR OPERATING SAME

BACKGROUND OF THE INVENTION
1. Field of the Invention

The present invention relates to semiconductor memory technology. More particularly, the present invention relates to electrically programmable read only memory (EPROM) devices and to ones of those devices known as "flash" EPROMs, and to methods for operating such devices.

2. The Prior Art

A great deal of interest has been displayed recently in flash EPROMs. Flash EPROMs are memory devices which are programmed by injection of channel hot electrons to a floating gate and erased by tunneling of electrons from the floating gate to the substrate. The charge on the floating gate affects the current flow through the channel underlying the floating gate. This current can be sensed to determine the charge on the floating gate and, hence, the state of the memory bit.

A nonvolatile memory must have a large difference in the voltages used during programming and erasing and those used during reading in order that the data storage really be nonvolatile, that is that the leakage currents induced by the fields present during sensing be so much lower than those currents induced during writing that the charge is maintained for tens of years. This is usually accomplished by applying a voltage or voltages greater than 5 volts to the memory cells which are to be programmed or erased.

It is very desirable to have an array of flash EPROM cells which would operate entirely from the 5 volt power supply commonly found in modern digital systems. It is common today for a memory circuit to operate from a single 5 volt power supply where the higher programming and erase voltages are generated on chip by charge pumps. On-chip charge pumps are relatively inefficient and incapable of supplying even moderate amounts of current. It is therefore required that the nodes to which these charge pumps are connected draw little power.

For various reasons, the prior art has been unable to satisfy the need for a method for programming and erasing a flash EPROM cell which is suitable for use in a high density EPROM memory array and which permits complete operation of such an array from a single 5 volt power supply. There currently exists a need to provide such a method.

BRIEF DESCRIPTION OF THE INVENTION

The present invention is a means for operating a flash EPROM cell such that the band-to-band tunneling current is dramatically reduced and operation of the memory circuit from a single 5 volt power supply is made practicable.

According to the present invention, a flash EPROM cell may be erased by placing a negative voltage on the control gate of a flash EPROM cell having spaced apart source and drain regions in a semiconductor substrate, and having a floating gate, a control gate and a sidewall gate, while biasing the drain at a positive voltage.

DETAILED DESCRIPTION OF A PREFERRED EMBODIMENT

Figure 1:
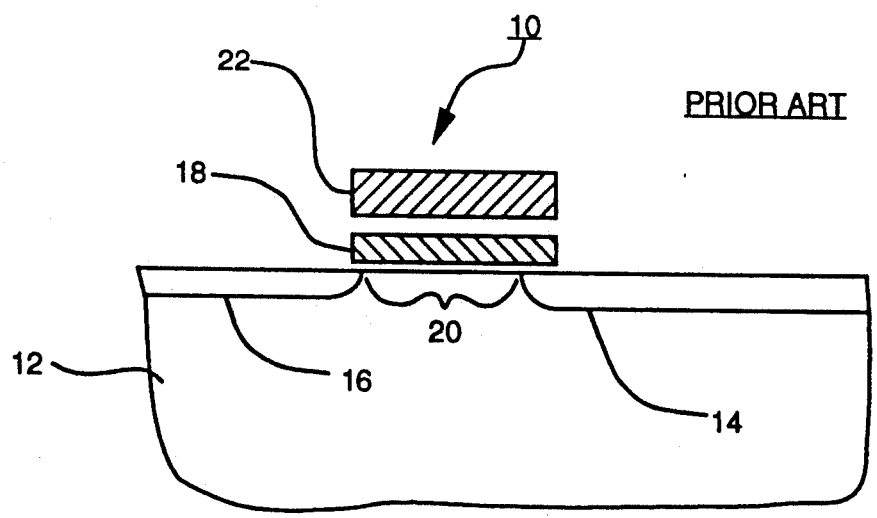
FIG. 1 is a cross-sectional view of a first example of a prior art EPROM cell.

FIG. 1 shows an example of a prior art EPROM memory cell which is described in GAUTAM Verma & Neal Mielke, *Reliability Performance of ETOX Based Flash Memories*, 26th Annual Proc. Rel. Phys. pp. 158–66 (1988). FIG. 1 shows a cross-sectional view of a memory cell 10 fabricated on a semiconductor substrate 12. The cell comprises a MOS transistor having a drain 14, a source 16, a conductively-isolated floating gate 18 disposed above channel region 20 and a control gate 22 disposed above floating gate 18.

The memory cell 10 was implemented as an n-channel transistor so that the substrate 12 was p type and the source and drain regions 14 and 26 were heavily-doped n type.

The state of the memory cell 10 of FIG. 1 is sensed by grounding the source 16, applying a positive voltage, usually about 5 volts, to the control gate 22, applying a smaller positive voltage, usually about 1.5 volts, to the drain 14 and sensing the current which flows from drain 14 to source 16. If the floating fate 18 is charged negatively, little current will flow. If the floating gate 18 is charged positively, a relatively large current will flow. Under the bias conditions which exist during sensing or during standby, the charge on the floating gate 18 will remain relatively unchanged for tens of years.

It is possible to change the charge state of the floating gate 18 by applying high voltages. If the control gate 22 is biased at about 12 to 15 volts, the drain 14 is biased at about 8 volts and the source 16 is grounded, electrons will flow from the source 16 to the drain 14. The high electric field existing at the drain 14 under these bias conditions will accelerate the arriving electrons to high energies. A few of these electrons will be collected on the floating gate 18, which will become negatively charged. The electrons may be removed from the floating gate 18 in memory cell 10 by grounding the control gate 22, floating the drain 14 and applying about 12 volts to the source 16. Because the oxide under the floating gate 18 is thin, e.g., about 10–12 nm, the electrons tunnel from the floating gate 18 to the source 16, leaving floating gate 18 charged positively.

The approach shown in FIG. 1 is not a good candidate for a true 5-volt-only flash EPROM memory array circuit because the drain current during programming is on the order of a milliampere per cell or 10 Ma per byte. It is not practicable to employ on-chip charge pumps to supply that level of current.

Figure 2:
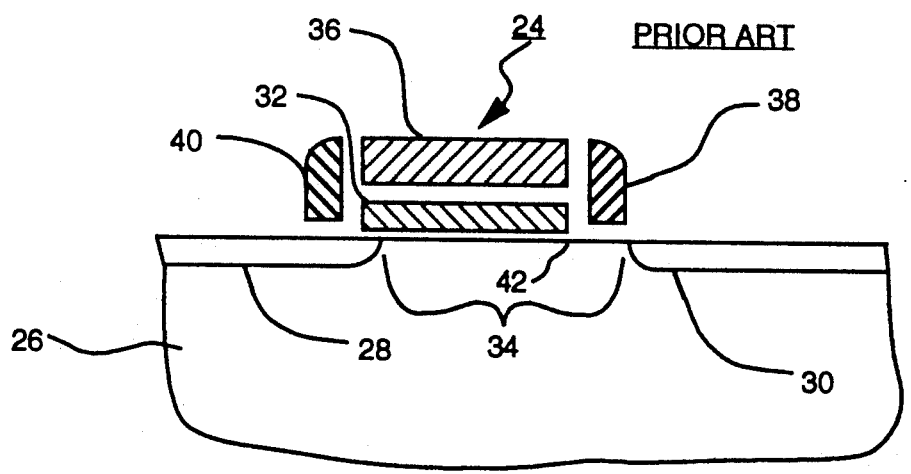
FIG. 2 is a cross-sectional view of a second example of a prior art EPROM cell.

FIG. 2 is a cross-sectional view of another prior art memory cell described in K. Naruke et al, *A New Flash-Erase EEPROM Cell with a Sidewall Select-Gate on its Source Side*, IEDM Tech. Digest, pp. 603–6 (1989). This flash memory cell 24 is fabricated on a semiconductor substrate 26 comprised of a compound gate transistor having a drain 28, source 30, floating gate 32 disposed above channel region 34, control gate 36, and a sidewall gate 38. The polysilicon line labeled 40 is an artifact of the process used to form the sidewall gate 38. It is biased at the same voltage as the sidewall gate 38 and, because it lies above a heavily doped channel 34, has little practical effect on the operation of the memory cell 24.

Sensing of this memory cell 24 is accomplished by biasing the drain at about 1 volt, grounding the source 30 and the control gate 36, biasing the sidewall gate 38 at about 5 volts, and detecting the magnitude of the drain current. Electrons are injected onto the floating gate 32 by applying about 5 volts to the drain 28, a high voltage, about 16 volts, to the control gate 36, biasing the sidewall gate 38 at about 1.5 volts, and grounding the source 30. A virtual drain 42 for the sidewall transistor is formed at the source end of the floating gate 32. Some of the hot electrons created at this virtual drain 42 by the above-stated voltage conditions are collected on the floating gate 32, thus imparting to it a negative charge. This negative charge induces a low current state during sensing.

Electrons are removed from the floating gate 32 by applying 14 volts to the drain 28 with the control gate 36 and sidewall gate 38 grounded. This induces electrons to tunnel through the gate oxide from the floating gate 32 to the drain 28.

The approach of FIG. 2 at first seems promising for a true 5-volt-only flash EPROM memory array in that the drain current is only 20 $\mu$A per cell and more importantly needs no charge pumping. However, the limiting factor for operating the memory cell of FIG. 2 in a 5-volt-only memory array of any appreciable size is the drain current during erasure.

The drain current of such a flash EPROM when operated as described above is dominated by gate-enhanced junction breakdown and band-to-band tunneling in the portion of the drain diffusion lying under the floating gate. Gate-enhanced junction breakdown can be suppressed by appropriate grading of the drain diffusion. However, band-to-band tunneling depends only weakly upon the drain profile and has a minimum value of about 1 Na/$\mu$ of junction edge for a device operated as described for the cell of FIG. 2. This is discussed in T. Endoh et al, *New Design Technology for EEPROM Memory Cells with* 10 *Million Write/Erase Cycling Endurance,* IEDM Tech. Digest, pp.599-602 (1989).

This means that for a 1M bit memory, all bits of which are to be erased simultaneously, the drain current is about 1 mA. Supplying 1 Ma at 14 volts from 5 volt supplied charge pump is not practicable.

Figure 3:
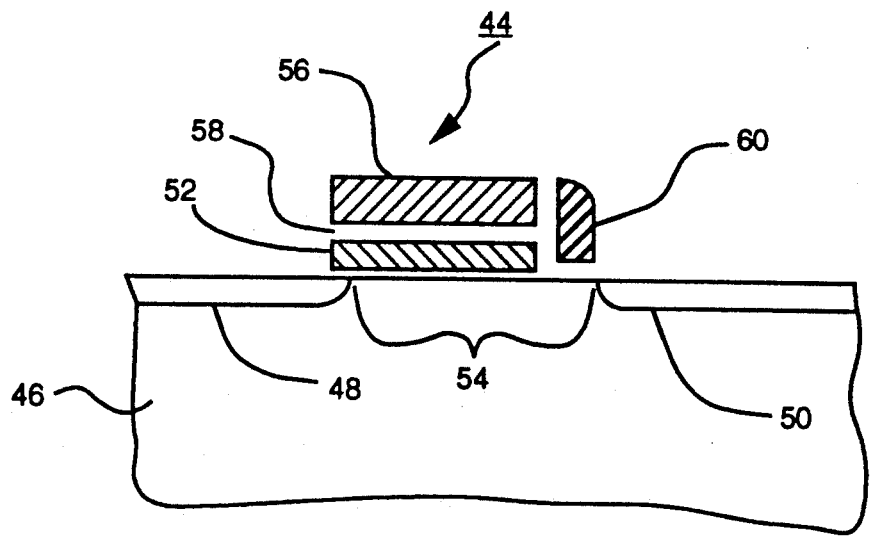
FIG. 3 is a cross-sectional view of a flash EPROM cell according to the present invention.

FIG. 3 is a cross-sectional view of a flash EPROM memory cell according to a presently preferred embodiment of the invention. The memory cell 44 of the present invention may be fabricated directly in a silicon substrate or in a well region in a silicon substrate as is well known in the art. Substrate 46 may be either. Drain region 48 and source region 50 are located in substrate 46.

Floating gate 52 lies over the channel 54 formed between drain 48 and source 50 but does not extend all the way to source 50. A control gate 56 lies over floating gate 52 and is separated from floating gate 52 by an inter-gate dielectric layer 58. A sidewall gate 60 is formed on the source side of floating gate 52 and control gate 56, spanning the portion of the channel 54 between the edge of floating gate 52 and source 50.

The flash EPROM memory cell 44 of the present invention represents an improvement upon the memory cell of FIG. 2 in which the unnecessary artifact 40 on the drain side has been removed. Like the cell in FIG. 2, the state of memory cell 44 is sensed by biasing the sidewall gate 60 at about 5 volts, biasing the drain 48 at between 1 volt and 2 volts, grounding the source 50 and biasing the control gate 56 so that programmed cells conduct little current and erased cells conduct substantial current.

Like the memory cell depicted in FIG. 2, the memory cell 44 of the present invention depicted in FIG. 3 may be programmed by biasing the sidewall gate 60 at a voltage in the range 1.5 volts to 2.5 volts, biasing the control gate 56 at a voltage in the range 12 volts to 18 volts, grounding the source 50, and applying about 5 volts to the drain 48.

According to a presently preferred embodiment of the invention, the memory cell 24 of FIG. 2 and the memory cell 44 of FIG. 3 may be advantageously erased. Unlike the known methods used to erase the prior art memory cell depicted in FIG. 2, according to the present invention, the control gate 36 of memory cell 24 and the control gate 56 of the memory cell 44 of the embodiments of FIGS. 2 and 3 may be biased at a negative voltage during erasure of the cell. The method of erasing these memory cells according to the present invention takes advantage of both the fact that the Fowler-Nordheim tunneling which extracts electrons from the floating gate 52 depends only upon the voltage difference between the drain diffusion 50 and the floating gate 52, independent of the voltages of these two nodes relative to the remainder of the circuit, and the fact that the band-to-band tunneling current in the drain 48 increases roughly exponentially with increase in drain voltage with respect to the source 50 and substrate 46.

When the control gate 56 is taken to a negative voltage, it capacitively couples the floating gate 52 to a more negative potential and thus increases the voltage drop between the floating gate 52 and the drain 48 if the drain 48 is held at a fixed positive potential. Biasing the control gate 56 at a negative value allows the drain voltage to be at a smaller positive value for the same voltage drop between floating gate 52 and drain 48. Thus, negative biasing of the control gate 56 during erasure allows the magnitude of the drain voltage and the magnitude of the drain current to be reduced simultaneously.

The general idea of negatively biasing the control gate 56 according to the present invention can be implemented using two different approaches. Both approaches assume the use of a p-channel driver in CMOS technology for the control gate line.

Figure 4:
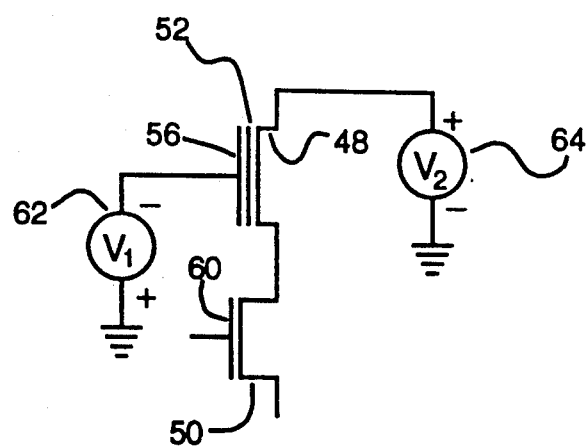
FIG. 4 is schematic/block diagram of apparatus for erasing the memory cell of FIG. 3, and illustrates the method for erasing such cells according to the present invention.

The approaches according to the present invention for erasing the memory cell of FIG. 3 are most easily understood with reference to FIG. 4, a schematic diagram of a single memory cell. A first voltage source 62 is connected to the control gate 56 It is negative with respect to ground as shown in FIG. 4. A second voltage source 64 is connected to the drain 48. It is positive with respect to ground. Those of ordinary skill in the art will understand that, although the substrate of the integrated circuit containing the memory cell will usually be at ground, sometimes a slightly negative substrate bias will be utilized in a particular design. The offset of a few volts due to the use of substrate biasing will not affect the principles of operation of the present invention.

In a first approach according to the present invention, the control gate 56 is negatively biased at a relatively modest value, i.e. between about −4 to −7 volts, preferably about −5 volts. This allows the drain voltage to be between about 8 to 12 volts, preferably about 9 volts, which is 3 volts lower than it would need to be if the control gate was grounded, depending upon the floating gate coupling ratios. Reducing the drain voltage by this value has been shown to reduce the band-to-band tunneling current by approximately two orders of magnitude, Rajat Rakkhit et al, *Drain-Avalanche Induced Hole Injection and Generation of Interface Traps in Thin Oxide MOS Devices*, 28th Annual Proc. Rel. Phys. pp. 150-3 (1990). This reduces the drain current for erasing a 1M bit flash EPROM from about 1 Ma to about 10 µA. The latter value is small enough to be practicably generated by an on chip charge pump which is supplying 9 volts to 15 volts from a 5 volt power supply and makes truly possible a 5-volt-only flash EPROM array of appreciable density.

The approach of the present invention makes only modest demands upon the drain junction breakdown of the p-channel transistors used as control gate line drivers. This parameter need have a value only in the range of 12 volts to 14 volts to make this approach feasible, a feat easily accomplished using presently-available CMOS process technology.

A second, more aggressive approach according to the present invention is to bias the drain 48 at $V_{cc}$ during erasure, i.e., at about 5 volts, the power supply voltage normally encountered in the chip. This approach requires that a more negative bias, i.e., between about −8 to −13 volts, be applied to the control gate 56 during erasure which in turn requires that the drains of the p-channel transistors used as control gate drivers be able to withstand higher voltages.

This second approach has several advantages. One advantage is that only one charge pump is operated during erasure, i.e. the pump which generates the voltage for the negative control gate bias. Any drain current is supplied directly from the 5-volt power supply and not from a charge pump; the load on the negative charge pump from the array is only the displacement current for erasing the cells which amounts to about 10 Na for a scaled 1M bit memory with 1 second erase time.

A final advantage of this approach according to the present invention is that it allows selective erasure of a single row of memory cells with no increase in array size merely by decoding the control gate lines during the erase mode. In a typical memory array, these lines already have decoders for use in the programming mode so decoding during erase mode merely involves enabling circuitry already on the chip and so requires minimal additional die area.

Figure 5:
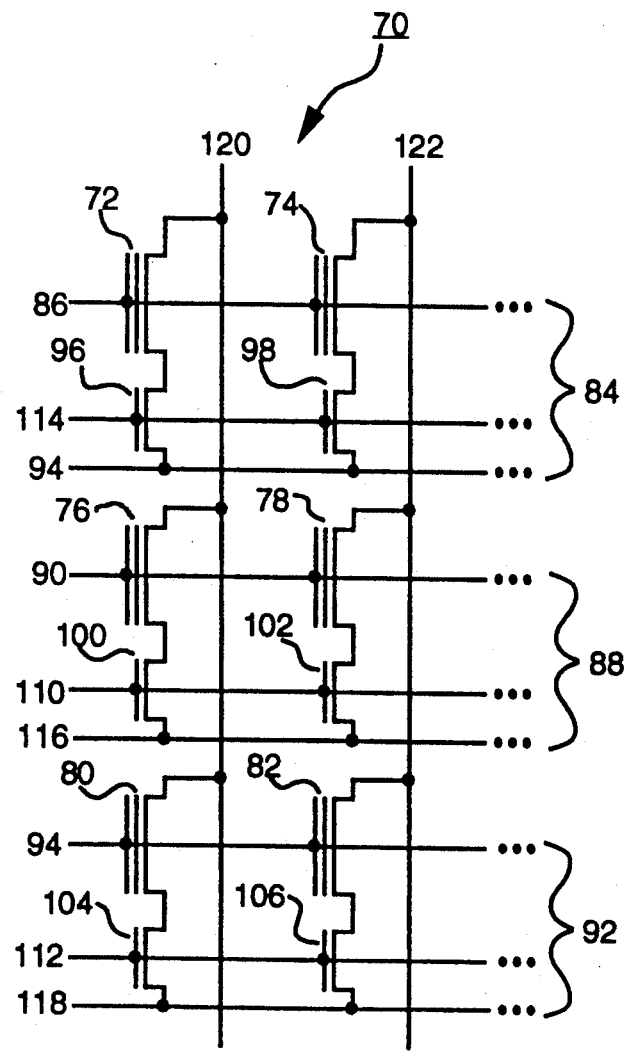
FIG. 5 is a block diagram of an array of memory cells which may be easily block erased according to the present invention.

Referring now to FIG. 5, a block diagram of an array of memory cells which may be easily block erased according to the present invention is depicted. Array 70 includes a plurality of memory cells 72, 74, 76, 78, 80, and 82 of the type depicted in either FIG. 2 or FIG. 3. Memory cells 72 and 74 are located in a first row 84 of the memory cell array 70, and their control gates are connected to a common control line 86. Memory cells 76 and 78 are located in a second row of 88 memory cell array 70, and their control gates are connected to a common control line 90. Memory cells 80 and 82 are located in a third row 92 of memory cell array 70, and their control gates are connected to a common control line 94. Those of ordinary skill in the art will recognize that control lines 86, 90, and 94 may be driven by p-channel transistors (not shown).

Each of the memory cells in the array 70 is connected in series at its source with a select transistor. Thus memory cell 72 is connected in series with select transistor 96, memory cell 74 is connected in series with select transistor 98, memory cell 76 is connected in series with select transistor 100, memory cell 78 is connected in series with select transistor 102, memory cell 80 is connected in series with select transistor 104, and memory cell 82 is connected in series with select transistor 106.

The gates of select transistors 96 and 98 are connected to a first select line 108. The gates of select transistors 100 and 102 are connected to a second select line 110. The gates of select transistors 104 and 106 are connected to a third select line 112. The sources of select transistors 96 and 98 are connected to a first source line 114. The sources of select transistors 100 and 102 are connected to a second source line 116. The sources of select transistors 104 and 106 are connected to a third source line 118. In a typical array fabricated according to the present invention, source lines 114, 116, and 118 will be tied together.

Bit line 120 is connected to the drains of memory cells 72, 76, and 80. Bit line 122 is connected to the drains of memory cells 74, 78, and 82. Bit lines 120 and 122 are used to sense the state of the memory cells to which they are connected, as well as for erasing the memory cells to which they are connected.

A single row of memory cells in array 70 may be erased by placing all bit lines at +5 volts, and by placing the negative erase voltage only on the control line associated with the row to be erased. For example to erase the first row 84 of array 70, bit lines 120 and 122 may both be biased at +5 volts and the negative erase voltage is placed on control line 86 while control lines 90 and 94 are held at a voltage near ground potential. During erasure, either source lines 114, 116, and 118 must be floating, or select lines 108, 110, and 112 must be low.

A cell which erases with +12 volts on the drain 48 with a grounded control gate 56 may typically require that the control gate 56 be biased at −11 volts with 5 volts on the drain 48. From such requirements, it follows that the drains of the p-channel transistors used as control gate drivers be able to withstand about −20 volts with respect to the n-well, a requirement within the level of skill in the CMOS processing art.

While a presently-preferred embodiment of the invention has been disclosed, those of ordinary skill in the art will, from an examination of the within disclosure and drawings be able to configure other embodiments of the invention. These other embodiments are intended to fall within the scope of the present invention which is to be limited only by the scope of the appended claims.

What is claimed is:

1. In a flash EPROM memory cell formed in a silicon substrate or in a well region in a silicon substrate, said memory cell having spaced-apart source and drain regions establishing a channel, a floating gate located over said channel and extending only part way to said source, a control gate over said floating gate, and a sidewall gate disposed on the source side of said floating gate, said sidewall gate spanning the portion of said channel between the edge of said floating gate and said source, a method for removing electrons from said floating gate, including the steps of:

allowing said source to float, placing a negative voltage of about between −8 and −13 volts on said control gate, placing a positive voltage of about +5 volts on said drain.

2. In a flash EPROM memory array fabricated as an integrated circuit, said array including a plurality of flash memory cells formed in a silicon substrate or in a well region in a silicon substrate, each of said flash memory cells having spaced-apart source and drain regions establishing a channel, a floating gate located over said channel and extending only part way to said source, a control gate over said floating gate, and a sidewall gate disposed on the source side of said floating gate, said sidewall gate spanning the portion of said channel between the edge of said floating gate and said source, said array arranged as a plurality of rows and columns wherein the control gates of all of said flash memory cells associated with a given row of said array are connected to a common control line and the drains of all of said flash memory cells associated with a given column of said array are connected to a common bit line, a method for removing electrons from the floating gates of all of said memory cells associated with a selected one of said rows, including the steps of:

allowing the sources of said plurality of flash memory cells to float, placing a negative voltage of about between −8 and −13 volts on the common control line associated with said selected row of flash memory cells, placing a positive voltage of about +5 volts on the common bit line associated with said selected row of flash memory cells.

* * * * *